United States Patent [19]

Murai et al.

[11] Patent Number: 4,983,864
[45] Date of Patent: Jan. 8, 1991

[54] ELECTRONIC BEAM DRAWING APPARATUS

[75] Inventors: Fumio Murai, Tokyo; Shinji Okazaki, Urawa, both of Japan

[73] Assignee: Hitachi, Ltd., Tokyo, Japan

[21] Appl. No.: 328,854

[22] Filed: Mar. 27, 1989

[30] Foreign Application Priority Data

Mar. 30, 1988 [JP] Japan ................................. 63-74292

[51] Int. Cl.$^5$ .............................................. H01J 37/30
[52] U.S. Cl. ................................... 250/492.2; 250/397
[58] Field of Search ............... 250/306, 307, 311, 310, 250/397, 492.2

[56] References Cited

U.S. PATENT DOCUMENTS 4,812,651  3/1989  Feuerbaum et al. ................. 250/305
4,829,177  5/1989  Hirsch .................................. 250/306
4,857,742  8/1989  Kato et al. ........................ 250/492.2

OTHER PUBLICATIONS

T. H. Newman, et al., "High Resolution Patterning System with Single Bore Object Lens", Journal of Vacuum Science and Technology, B vol. 5, No. 1, Jan.-/Feb. 1987, pp. 88-91, (in English).
J. C. Edison, et al., "A High Speed Electron Beam Lithography System", Journal of Vacuum Science and Technology, 19(4), Nov./Dec. 1981, pp. 932-935, (in English).

Primary Examiner—Bruce C. Anderson
Attorney, Agent, or Firm—Fay, Sharpe, Beall, Fagan, Minnich & McKee

[57] ABSTRACT

An electron beam drawing apparatus having a grounded conductor for a screening operation in the neighborhood of a detection surface of a detector to detect a reflected electrons obtained by irradiating an electron onto a specimen and a secondary electron generated through the electron irradiation. The conductor has openings to pass therethrough the reflected electron and the secondary electron. As a result, the electric charge accumulated on an organic substance fixed onto the front surface of the detector through the electron irradiation is prevented from exerting an influence on the drawing electron beam.

5 Claims, 2 Drawing Sheets

ELECTRONIC BEAM DRAWING APPARATUS

BACKGROUND OF THE INVENTION

The present invention relates to an electronic beam drawing apparatus, and in particular to, an electron beam drawing apparatus capable of effecting a drawing with a high precision even when there appears a phenomenon in which an organic substance of a drawing objective specimen fixes onto the apparatus.

An electron beam drawing method develops a higher resolution as compared with the conventional optical transcribing method and is hence broadly employed in a pattern generate operation for a precision of a submicron region. The electron beam drawing method is efficient not only in the fine work but also in a highly accurate position alignment. The reason for the high precision of the position alignment resides in that a mark disposed on the side of a substrate is detected by a highly focused electron beam, namely, the detection is accomplished with a high accuracy and in that even when a drawing objective specimen is deformed in an intermediate process, the drawing can be conducted by correcting the deformation.

In the conventional electron beam drawing apparatus, as shown in FIG. 2, an electron beam 2 emitted from a filament 1' of an electron gun 1 is focused and is then shaped through several electron lenses 3, that is, the shape of the electron beam 2 is controlled so as to be deflected by a deflection lens 4 of which an amount of deflection of the beam 2 is controlled by means of an apparatus not shown, so that the beam 2 is irradiated onto a predetermined position of a drawing objective specimen 6 arranged on a movable stage 5. In this operation, a reflected electron 7 is captured by a reflection electron detector 8 and is then processed as positional information by a signal processor 9. As the reflection electron detector 8 in this process, there has been employed a combination including a semiconductor diode, a scintillator, and a photoelectric multiplier. An example of the apparatus of this type has been described in pages 88-91 of the Journal of Vacuum Science and Technology, B Vol. 5, No. 1, Jan/Feb 1987, or in pages 932-935 of the Journal of Vacuum Science and Technology, 19 (4), Nov/Dec 1981.

Since an electron beam is irradiated onto an electron beam resist as an organic film in the electron beam drawing apparatus, there appears a phenomenon in which a product as a result of a reaction effected through the electron beam irradiation is vaporized or an organic substance of the resist is vaporized by the heat produced at the irradiation. A portion of these organic substances or the like is exhausted by means of a vacuum pump and another portion thereof fixes onto parts of the drawing apparatus. In particular, as can be seen from FIG. 2, the reflection electron detector 8 is arranged at a position quite near to the drawing objective specimen 6; in consequence, the amount of the organic substances fixed onto the parts is increased. When the organic substances as an insulating material fix onto a surface of the reflection electron detector 8, there occurs a phenomenon in which due to the reflected electrons 7, electric charges are accumulated on the insulator such as the organic materials fixed on the surface of the detector 8. Because of the accumulated electric charge, the electron beam 2 undergoes a deflection in an electric field produced by the accumulated electric charge; in consequence, there arises a problem that the electron beam 2 does not correctly effect the drawing through predetermined positions determined by the deflection lens 4, which leads to an error in the drawing position.

SUMMARY OF THE INVENTION

It is therefore an object of the present invention to provide an electron beam drawing apparatus in which the drawing position of the electron beam is not influenced by the electric charge accumulated on the insulator such as the organic substances vaporized from the drawing objective specimen and fixed on a surface of the reflection beam detector.

In this invention, immediately before or in the vicinity of a surface of the reflection electron detector to be exposed to the reflected electron, there is arranged a conductor which has a space gap therein so as to be kept retained at a ground potential. The conductor is provided with an opening to pass therethrough reflected electrons, and the area of the opening is set to a large value, so that the reflection electron detector detects an electron reflection position with a high precision. The space gap disposed in the conductors in association with the shape of the opening is set to a small value so as to increase the effect of the electrostatic screening of the conductors. For this purpose, for example, a thin wire of metal is favorably employed as the conductor.

According to the present invention, due to the conductor which has a space gap therein and which is kept retained at the ground potential, the electric field produced by the electric charge accumulated on the organic substances and the like fixed on the surface of the reflection electron detector is screened such that the electric field does not influence a path or route of the electron beam emitted for the drawing operation; furthermore, it is possible to effect the detection of a position with a high precision kept unchanged by increasing the area of the opening of the conductor.

According to the present invention, since the electric field over the surface of the reflection electron detector is screened with respect to the route of the electron beam, even if there occurs a contamination in the housing of the electron beam drawing apparatus when the drawing operation thereof is conducted for a long period of time, it is possible to accomplish the drawing with the high precision of the initial stage kept unchanged.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Figure 1:
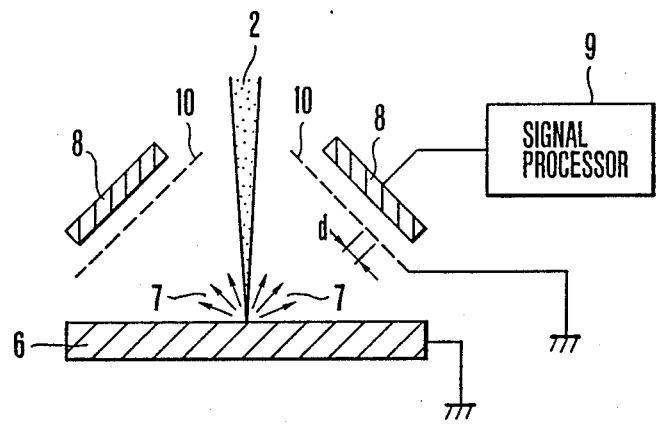
FIG. 1 is a cross-sectional view showing a configuration of a portion of an electron beam drawing apparatus according to the present invention.
Figure 3:
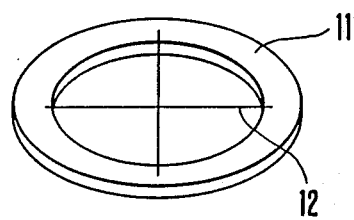
FIG. 3 is a perspective view showing a screen ring in an embodiment of an electron beam drawing apparatus according to the present invention.
Figure 4:
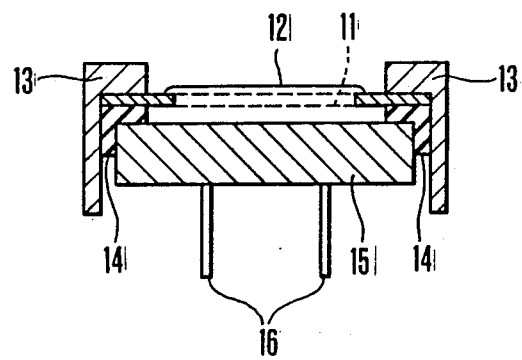
FIG. 4 is a cross-sectional view showing a configuration of a holder of an electron beam drawing apparatus in which the screen ring of FIG. 3 is incorporated.

Referring to FIGS. 1, 3, and 4, description will be given of an embodiment according to the present invention.

Figure 2:
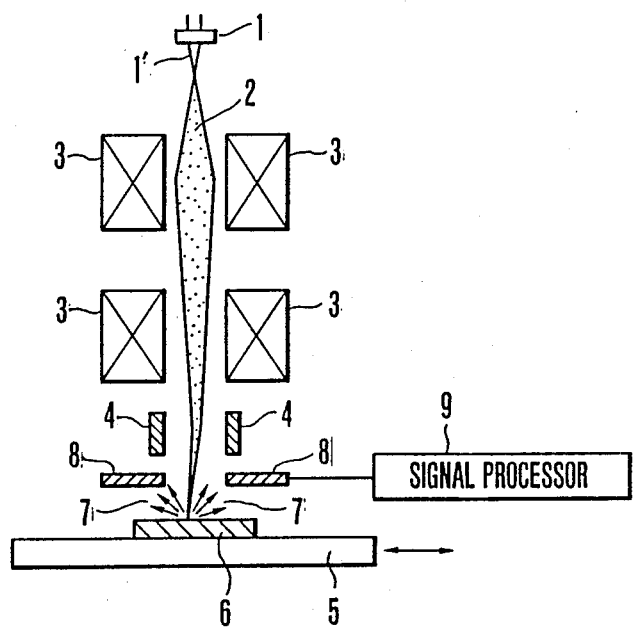
FIG. 2 is a cross-sectional view showing an outline of the electron beam drawing operation.

FIG. 1 shows a configuration of a portion of an embodiment as an electron beam drawing apparatus according to the present invention in which there is indicated a position where a drawing objective specimen is placed and in which a drawing is effected by use of an electron beam and a reflected electron is detected. The constitution of the other portions of the electron beam drawing apparatus is the same as that shown in FIG. 2 and hence description thereabout will be omitted.

As shown in FIG. 1, an electron beam 2 used to detect a position is irradiated onto a specimen 6 such that a reflected electron and a secondary electron 7 produced through the irradiation are passed through a space gap disposed in a grounded conductor 10 so as to be captured by a detector 8 and to be processed as positional information by a signal processor 9. Also in a case where an electric charge is accumulated on an organic substance such as a resist fixed onto a surface of a reflection electron detector, a range of influence exerted on areas outside the grounded conductor 10 by an electric field produced by the accumulated electric charge is substantially equal to a gap d, in consequence, the positional precision of the drawing electron beam is not lowered.

FIG. 3 shows a conductor ring having an inner diameter of 6 millimeters which is located immediately before a detection surface of the reflection electron detector so as to effect an electrostatic screening and which corresponds to the conductor 10 provided with space gap regions therein as shown in FIG. 1. As for a material of the conductor ring, if a material having a large atomic number is employed as the material, there occur unnecessary reflection and scattering of the electron beam, which in consequence leads to an unnecessary exposure. Consequently, the ring is desirably formed with a material of a small atomic number, for example, beryllium or aluminum. In this embodiment, as the material of the ring 11, there is adopted aluminum for which work can be easily achieved. In addition, in order to minimize the space gap in the conductor associated with the ground potential, fine aluminum wires each having a diameter of 25 micrometers are fixed to each other so as to form a cross-like shape according to a supersonic bonding method. FIG. 4 shows a semiconductor reflection electron detector in which the screen ring of FIG. 3 is incorporated. In a holder 13 formed with aluminum, there are mounted a screen ring 11 and a semiconductor detector 15 via an insulation ring 14. Since the holder 13 is kept retained at the ground potential in the electron drawing apparatus, the screen ring 11 and the fine aluminum wires 12 fixed thereonto are also set to the ground potential. When the semiconductor detector 15 is being used, a voltage is applied across electrodes 16 thereof. An electric field generated by the voltage and an electric field caused by the electric charge accumulated on the surface of the detector 15 are screened by the screen ring 11 and the fine aluminum wires 12 fixed thereon; in consequence, the route of the drawing electron beam is not influenced therefrom. In the conventional electron beam drawing apparatus, there has occurred a phenomenon in which the deflection distortion of the electron beam is increased when the apparatus is used for about six months after the apparatus undergoes a cleaning; however, in the electron beam drawing apparatus according to the present invention, there does not occur such an increase in the distortion of the deflection even when the apparatus is used for one year.

Since the screen ring 11 adopted in this embodiment has an inner diameter of 6 millimeters, the fine wires 12 of a metal suffice as shown in FIG. 3; however, in a case of a greater inner diameter, it is desirable to increase the number of fine wires of a metal. The size of the space gap in the grounded conductor may be set to be substantially identical to the distance from the reflection electron detector to the surface of the specimen or to the route of the electron beam.

In addition, due to the arrangement of the fine wires of a metal in this embodiment, a portion of the reflected electrons is prevented from reaching the reflection electron detector, the amount thereof is about 1% of the total electrons and hence does not cause any trouble on the detected signal. In a case where the amount of the reflected electrons is sufficiently great, a conductor having a hole in a shape of a punch metal may be used in place of the screen ring so as to obtain an effect of adjusting the amount of the reflected electrons and an effect of an electrostatic screening at the same time.

While a particular embodiment of the invention has been shown and described, it will be obvious to those skilled in the art that various changes and modifications may be made without departing from the present invention in its broader aspects.

What is claimed:

1. An electron beam drawing apparatus for maintaining high positional precision during extended periods of usage comprising:
   a device for generating an electron beam;
   a device for controlling a shape of the generated electron beam;
   a device for deflecting the controlled electron beam;
   a stage for placing a specimen to be subjected to a drawing by use of the deflected electron beam;
   a detector means disposed relative to the specimen for detecting a reflected electron obtained when an electron is irradiated onto the specimen by an electron beam; and
   a grounded conductor disposed immediately before the detector for a screening operation in immediate proximity of a surface of said detector to be exposed to the reflected electron, said conductor having an opening for passing therethrough the reflected electron wherein the screening operation screens an electric field generated by charges accumulated within insulating substances fixed to the detector.

2. The apparatus as claimed in claim 1 wherein the detector is disposed opposite to the specimen.

3. The apparatus as claimed in claim 1 wherein the detector is disposed oblique to the specimen.

4. An electron beam drawing apparatus comprising:
   a device for generating an electron beam;
   a device for controlling a shape of the generated electron beam;
   a device for deflecting the controlled electron beam;
   a stage for receiving a specimen on which a drawing is to be made by the deflected electron beam, which specimen reflects electrons and emits secondary electrons during irradiation by the deflected electron beam;

a detector disposed opposite to the specimen for detecting the reflected and secondary electrons; and,
a grounded conductor having an opening for passing the reflected and secondary electrons, the grounded conductor being disposed immediately before the detector for screening the detector from electric fields.

5. An electron beam drawing apparatus comprising:
a device for generating an electron beam;
a device for controlling a shape of the generated electron beam;
a device for deflecting the controlled electron beam;
a stage for receiving a specimen on which a drawing is to be made by the deflected electron beam, which specimen reflects electrons and emits secondary electrons during irradiation by the deflected electron beam;
a detector disposed obliquely to the specimen for detecting the reflected and secondary electrons; and,
a grounded conductor having an opening for passing the reflected and secondary electrons, the grounded conductor being disposed immediately before the detector for screening the detector from electric fields.

* * * * *